United States Patent
Hahn et al.

(10) Patent No.: US 6,776,864 B2
(45) Date of Patent: Aug. 17, 2004

(54) PROCESS-FOR FORMING METAL MICRO-PATTERNS ON PLASTIC SUBSTRATE

(75) Inventors: Jong Hoon Hahn, Pohang-si (KR); Yong Min Park, Paju-si (KR); Young Chan Kim, Taejeon (KR); Bong Chu Shim, Seoul (KR)

(73) Assignee: Postech Foundation (KR)

( * ) Notice: Subject to any disclaimer, the term of this patent is extended or adjusted under 35 U.S.C. 154(b) by 0 days.

(21) Appl. No.: 10/211,122

(22) Filed: Aug. 2, 2002

(65) Prior Publication Data

US 2003/0024632 A1 Feb. 6, 2003

(30) Foreign Application Priority Data

Aug. 4, 2001 (KR) ......................... 2001-47123

(51) Int. Cl.[7] .......................... B41M 3/12; B05D 3/10; B05D 5/12; B32B 31/20; B32B 31/22
(52) U.S. Cl. .................... 156/230; 156/233; 156/239; 156/240; 156/247; 427/146; 427/256; 427/261; 427/337; 428/195.1; 428/209; 428/914
(58) Field of Search ................... 156/230, 233, 156/237, 240, 241, 247, 249; 427/146, 147, 148, 96, 256, 261, 269, 272, 282, 337, 383.5; 428/9.4, 46.9, 105, 201, 202, 209, 343, 344, 915, 195.1

(56) References Cited

U.S. PATENT DOCUMENTS

| | | | | |
|---|---|---|---|---|
| 4,775,439 A | * | 10/1988 | Seeger et al. | 156/231 |
| 4,790,893 A | * | 12/1988 | Watkins | 156/232 |
| 4,869,767 A | * | 9/1989 | Robinson et al. | 156/233 |
| 5,017,255 A | * | 5/1991 | Calhoun et al. | 156/230 |
| 5,512,131 A | * | 4/1996 | Kumar et al. | 438/738 |
| 6,060,121 A | * | 5/2000 | Hidber et al. | 427/261 |
| 6,162,569 A | * | 12/2000 | Nakashima et al. | 430/7 |

FOREIGN PATENT DOCUMENTS

| | | | | |
|---|---|---|---|---|
| GB | 2217918 | * | 11/1989 | |
| JP | 54-27959 | * | 3/1979 | H05K/3/20 |
| JP | 2003-78235 | * | 3/2003 | H05K/3/20 |
| MX | 184341 | * | 4/1997 | B32B/23/00 |
| WO | WO 99/16601 | * | 4/1999 | B29B/31/00 |

* cited by examiner

Primary Examiner—Jerry A. Lorengo
(74) Attorney, Agent, or Firm—Anderson Kill & Olick, PC (57) ABSTRACT

A process, which comprises forming a metal micro-pattern on the surface of an inorganic substrate, surface-treating the surface of the metal micro-pattern and the surface of the plastic substrate to make it chemically reactive, and bringing the metal micro-pattern into contact with the surface of the plastic substrate to transfer the metal micro-pattern from the surface of the inorganic substrate to the surface of the plastic substrate, can be easily and simply carried out using conventional equipments to produce one or more metal pattern fixed on a plastic material.

11 Claims, 7 Drawing Sheets

PROCESS-FOR FORMING METAL MICRO-PATTERNS ON PLASTIC SUBSTRATE

FIELD OF THE INVENTION

The present invention relates to a process for forming metal thin-film micropatterns on a plastic substrate by way of transferring metal micropatterns formed on an inorganic substrate to a plastic substrate.

BACKGROUND OF THE INVENTION

Microchip devices, which have been used to perform liquid phase separations, e.g., electro-chromatography and electrophoresis, and to mix reagents in an integrated microreactor for chemical reactions, have many advantages over conventional bench-scale instruments in terms of increased speed of analysis, reduced reagent consumption, and amenability to automation through computer control. These integrated devices are now being referred to as a "lab-on-a-chip", as the operations of a complete wet chemical laboratory can be integrated on a chip.

A lab-on-a-chip conventionally comprises a number of micro-channels formed on a glass, silicon or plastic substrate, through which fluids are delivered. Recently, the plastic lab-on-a-chips have been favored, and therefore, many attempts have been made to develop a convenient and economic method for manufacturing plastic lab-on-a-chips.

Typically, the micro-pattern formed on a glass or silicon substrate is prepared by a process which comprises a metal deposition step followed by a photolithography step. When a plastic substrate is used, it is difficult to form a metallic micro-pattern directly on the surface of the plastic due to its high thermal expansion coefficient, sensitivity to organic solvents and weak interaction between plastic surface and metal pattern, and accordingly, a screen-printing or electroplating method has conventionally been used (see U.S. Pat. No. 6,030,515).

However, the screen-printing or electroplating method has disadvantages in that it is difficult to control the thickness or to reduce the line width of the micro-pattern to below a mm unit, and the surface of the micro-pattern formed has low adhesion to another plastic substrate, making it difficult to fabricate a plastic lab-on-a-chip system.

Therefore, there is an existed need to develop an improved method for forming a metal micro-pattern on a plastic substrate so that the fabrication of a plastic lab-on-a-chip system can be facilitated.

SUMMARY OF THE INVENTION

Accordingly, it is a primary object of the present invention to provide a novel and convenient process for forming a metal micro-pattern on a plastic substrate.

Further more, it is an object of the present invention to provide a process for the mass production of a plastic lab-on-a-system using a plastic substrate having a metal micro-pattern formed by the inventive process.

In accordance with one aspect of the present invention, there is provided a process for forming a micro-pattern of a metal on a plastic substrate, which comprises forming a metal micro-pattern on the surface of an inorganic substrate, surface-treating the surface of the metal micro-pattern or the surface of the plastic substrate to make it chemically reactive, and bringing the metal micro-pattern into contact with the surface of the plastic substrate to transfer the metal micro-pattern from the surface of the inorganic substrate to the surface of the plastic substrate.

In accordance with another aspect of the present invention, there is provided a micro-structured article prepared by plating the metal micro-pattern formed on a plastic substrate according to the inventive process with a conductive metal, which can be used as a free-standing metal micro-structure or a mold for the production of other micro-structured articles.

In accordance with further aspect of the present invention, there is provided a plastic lab-on-a-chip system fabricated by coupling a plastic substrate having a metal pattern formed according to the inventive process with another plastic substrate.

BRIEF DESCRIPTION OF THE DRAWINGS

The above and other objects and features of the present invention will become apparent from the following description of the invention, when taken in conjunction with the accompanying drawings which respectively show.

DETAILED DESCRIPTION OF THE INVENTION

The process for the formation of a metal micro-pattern on a plastic substrate according to the present invention is characterized by transferring a metal micro-pattern formed on an inorganic substrate to the surface of the plastic substrate, wherein at least one of the surfaces of the metal pattern and the plastic substrate is rendered chemically reactive by prior surface treatment.

Figure 1:
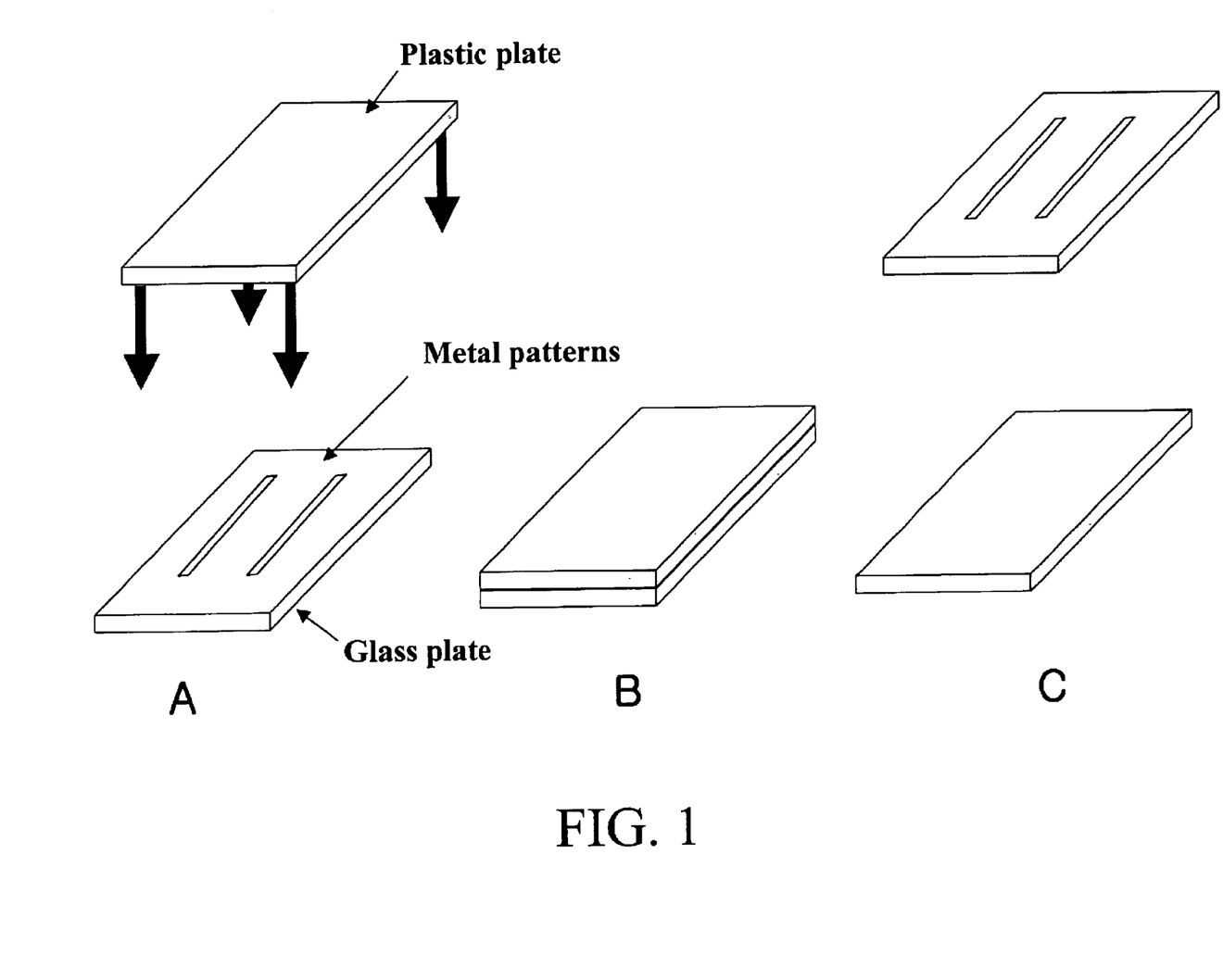
FIG. 1: a schematic illustration of the procedure of forming a metal micro-pattern according to the present invention.

Referring to FIG. 1, which illustrates the transfer procedure of a metal micro-pattern according to the present invention, "step A" shows a glass plate having a metal pattern formed thereon, and a plastic plate to which the metal pattern is to be transferred; "step B" shows the glass plate laminated with the plastic substrate, and "step C" shows that the metal pattern is transferred from the glass plate to the plastic plate.

In order to perform the transfer a metal pattern to a plastic substrate as shown in FIG. 1, the following conditions must be met:

1) the adhesion of the metal film pattern to the inorganic substrate is just strong enough to endure the patterning procedure;

2) the metal pattern is transferable during the transfer procedure;

3) the plastic substrate has sufficient affinity to the metal to be transferred; and 4) the metal pattern transferred on the plastic is fixed in a stable manner.

The formation of a metal pattern on an inorganic substrate is conventionally conducted by depositing a metal film on the substrate under a vacuum, and patterning the metal film thus deposited using a photolithographic procedure. Further, representative examples of the metal used for forming a metal film are gold (Au), silver (Ag) and copper (Cu) and the thickness of the metal film may range from 10 Å to 1 mm. The inorganic substrate, which may be suitably used in the deposition procedure of the metal component is selected from the group consisting of glass, silica, mica and quartz.

Adjusting the deposition rate thereof controls the adhesive strength of the metal pattern to the inorganic substrate, so that the metal pattern can be detached from the inorganic substrate and transferred to a plastic substrate during the transfer procedure.

The present invention employs an elastic plastic as a plastic substrate to which a metal pattern is transferred, and representative examples thereof include poly(dimethylsiloxane) (PDMS), poly(methylmethacrylate) (PMMA) and polycarbonate (PC), among which, PDMS is the most preferred due to its good optical transmittance and moldability.

Further, in accordance with the present invention, in order to firmly fix the metal pattern to the plastic substrate, the surface of the metal pattern or the surface of the plastic substrate is surface-treated to make it chemically reactive prior to the transfer step. The surface-treatment may be carried out chemically, e.g., by forming a self-assembled monolayer on the surface, or physically, e.g., by applying corona discharge oxidation, plasma oxidation, electron beam or UV light exposure to the surface.

A self-assembling material, e.g., a thiol group-containing compound (e.g., 3-mercatopropyltrimethoxysilane), trichlorosilane and trimethoxysilane, is capable of self-assembling to form a layer on the surface of a metal or plastic to render the surface chemically reactive.

The self-assembled monolayer may be formed by dipping a substrate having a metal pattern thereon into a 1 $\mu$M to 1 mM ethanol solution of a self-assembling material for a time sufficient to form a self-assembled monolayer, or by contacting the substrate with the vapor of a self-assembling material.

The treatment of the surface with corona discharge oxidation, plasma oxidation, electron beam or UV light exposure may be conducted in a conventional manner known in the art.

Figure 2:
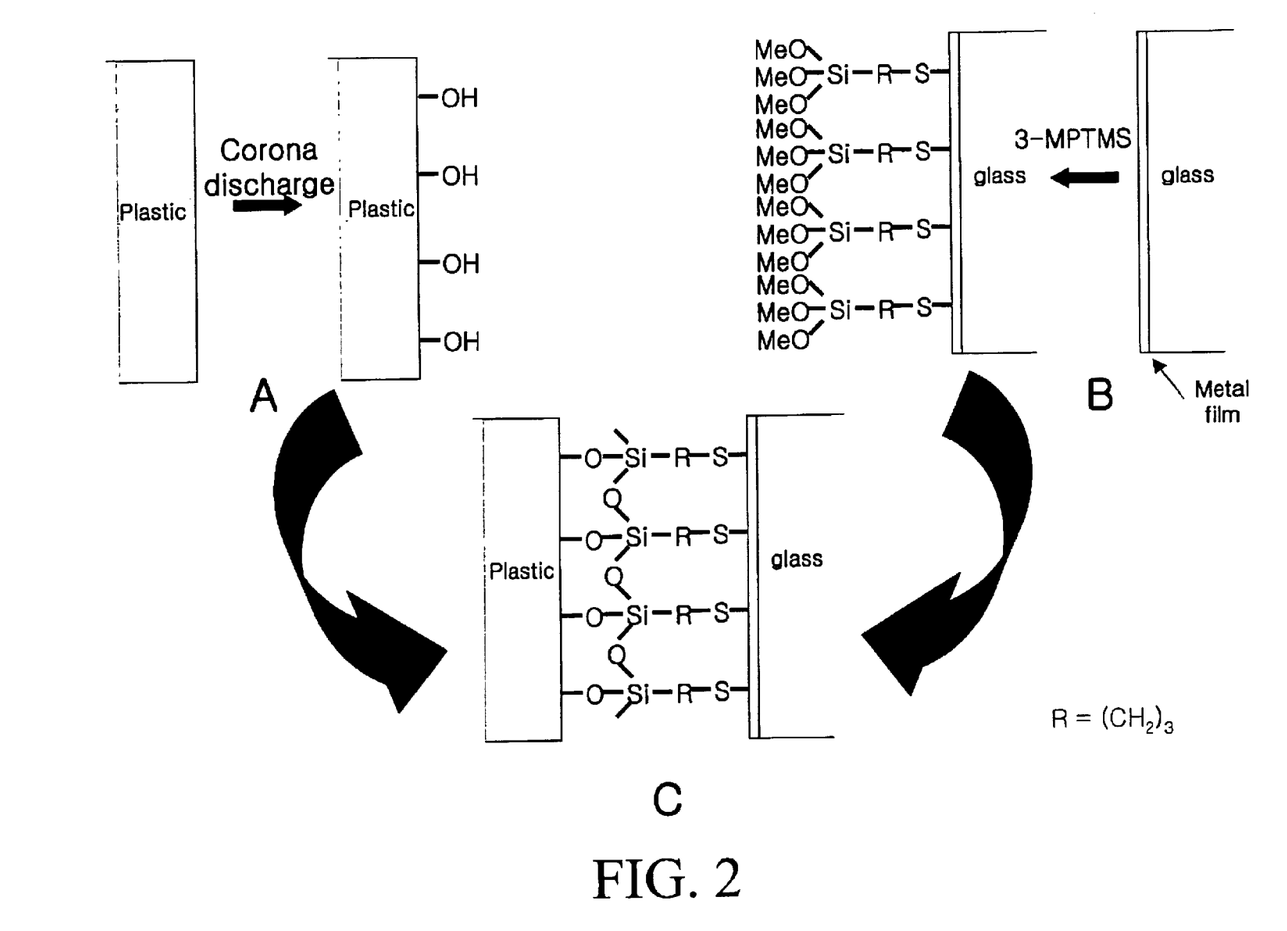
FIG. 2: a schematic illustration of the surface treatment procedure of metal film on a glass substrate and a plastic substrate in accordance with the present invention.

FIG. 2 shows the above-mentioned surface treatment procedure in accordance with the present invention. In FIG. 2, "step A" represents a physical surface treatment of a plastic plate with corona discharge oxidation, "step B", a chemical surface treatment of a metal pattern formed on a glass plate with 3-mercaptopropyltrimethoxysilane (3-MPTMS), and "step C", the transfer of treated metal pattern to the treated plastic plate. Here, 3-MPTMS is used as a "chemical glue". Thiol (—SH) functional groups of 3-MPTMS are self-assembled on the gold surface, while thrimethoxysilane (—Si(OMe)$_3$) functional groups of 3-MPTMS are bound covalently with the oxidized plastic surface. After the surface treatments, metal micro-patterns are transferred from a glass substrate to a plastic by bringing the metal micro-patterns on glass substrate in direct contact with the oxidized plastic substrate.

Figure 3:
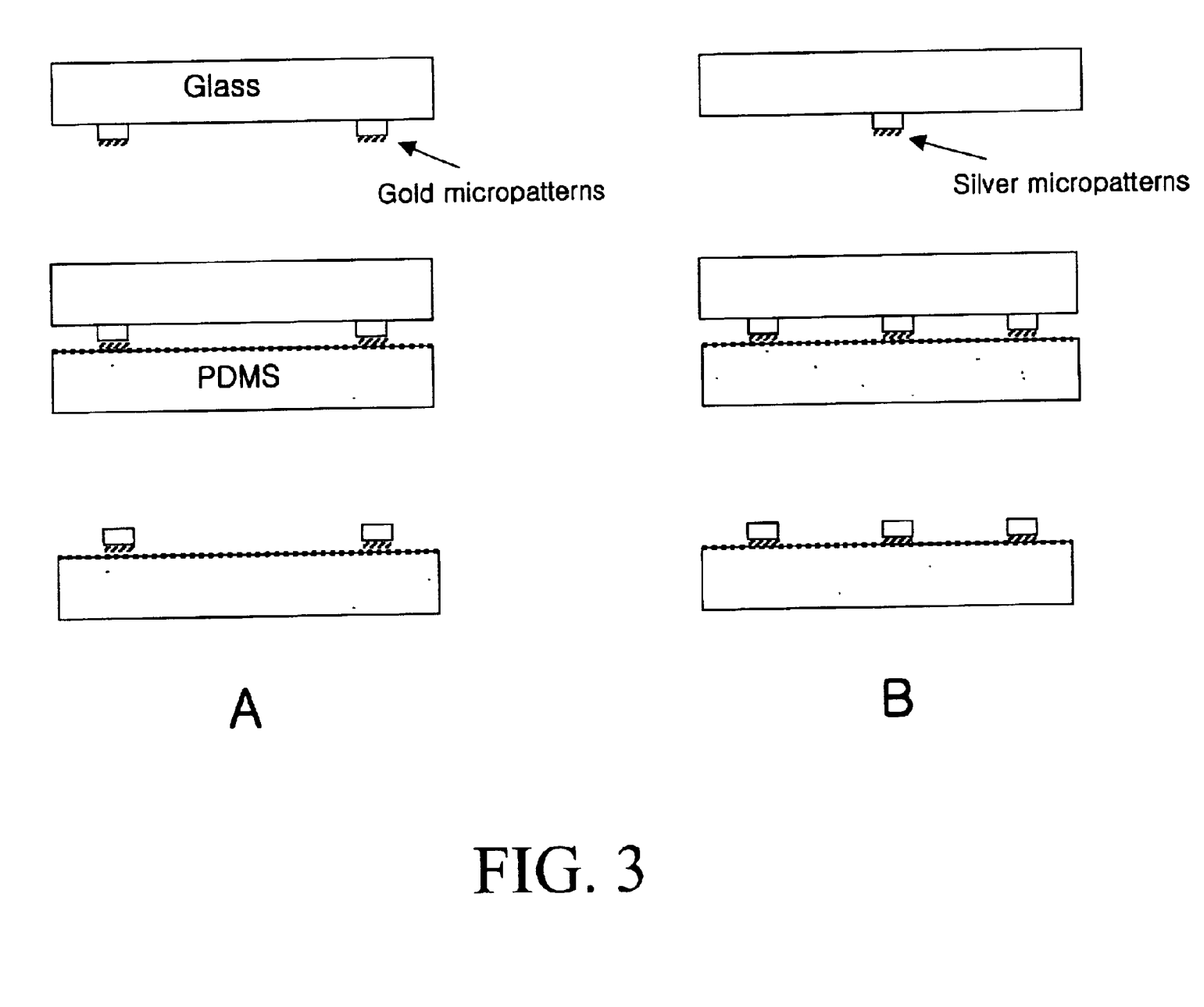
FIG. 3: a schematic illustration of the procedure of forming micro-pattern made from two kinds of metals according to the present invention.

The inventive process can be applied to transfer patterns of two or more metals. In this connection, FIG. 3 schematically shows that two or more metal micro-patterns (gold and silver) are formed by a photolithographic procedure, surface-treated with a self-assembling material, and then transferred to a plastic (PDMS) substrate in steps "A" to "B".

If desired, the metal micro-pattern formed on a plastic substrate in accordance with the present invention may be further plated with a conductive metal such as nickel or copper by a conventional method to form a micro-structured article which may be used as a mold for the production of other micro-structured articles. Furthermore, in accordance with the present invention, a plastic lab-on-a-chip system can be easily fabricated by coupling a plastic substrate having a metal pattern formed thereon by the inventive process to another plastic substrate, and the system may be coupled in a reversible or irreversible way using the techniques known in the art.

The inventive process can be easily and simply carried out using conventional equipments to produce one or more metal patterns fixed on a plastic material. Also, the thickness of the metal pattern can be easily controlled; and the metal pattern thus formed has a uniform thickness. Accordingly, the metal pattern formed by the inventive method may be advantageously employed in the manufacture of articles such as an electrochemical or conductivity detector, a temperature sensor, a micro radiator and a reaction apparatus, which can be fabricated into a portable high-performance lab-on-a-chip useful in the fields of chemistry, biotechnology, chemical/environmental engineering, etc.

The present invention is further described and illustrated in the following Examples, which are, however, not intended to limit the scope of the present invention.

EXAMPLE 1

Figure 4:
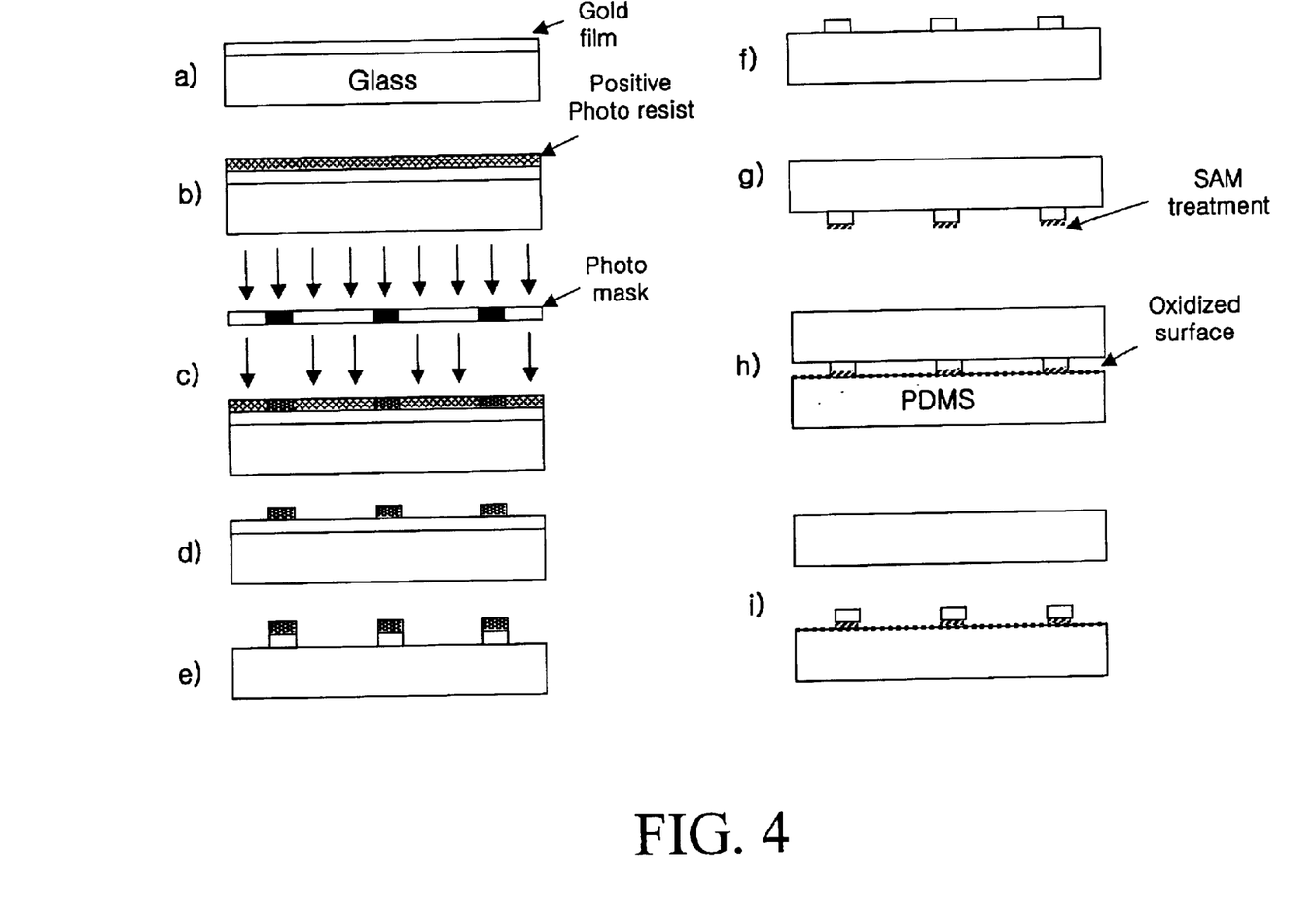
FIG. 4: a schematic illustration of the procedure of transferring a metal pattern from a glass plate to a plastic plate according to the procedure of Example 1.

According to the procedure shown in FIG. 4, a plastic (poly(dimethylsiloxane); PDMS) substrate having a metal micro-pattern formed thereon was prepared as follows;

On a clean glass plate, a Au layer having a thickness of 2000Å were thermal vapor deposited under a pressure of about $10^{-6}$ bar at a deposition rate of 5 Å/sec (Step a). A positive type photoresist DTFR-1000 (Dongjin chemical Corp. Seoul, Korea) was spin-coated on the Au coated plate (Step b), and UV was irradiated thereon through a photomask having a given pattern (Step c).

Subsequently, the plate was developed with a developer AZ 300MIF (Clariant Corp. Somerville, Calif., U.S.A.) (Step d), the exposed Au layers were etched, and the photoresist layer was removed with acetone to obtain a glass plate having a Au pattern formed thereon (Step e and f).

The plate was then dipped in a 0.1 mM 3-MPTMS in ethanol solution as a self-assembling material (SAM) to make the surface of the metal pattern chemically reactive (Step g). Separately, a PDMS plate was surface-treated with corona discharge oxidation for 1 minute using a corona discharging apparatus (BD-10A, Electro-Technic Products, Inc., Chicago, Ill., U.S.A.). The 3-MPTMS treated metal pattern of the plate was brought into contact with the treated surface of the PDMS plate (Step h), and the resulting laminate was compressed and detached to obtain a PDMS plate having the transferred Au pattern (Step i).

Figure 5:
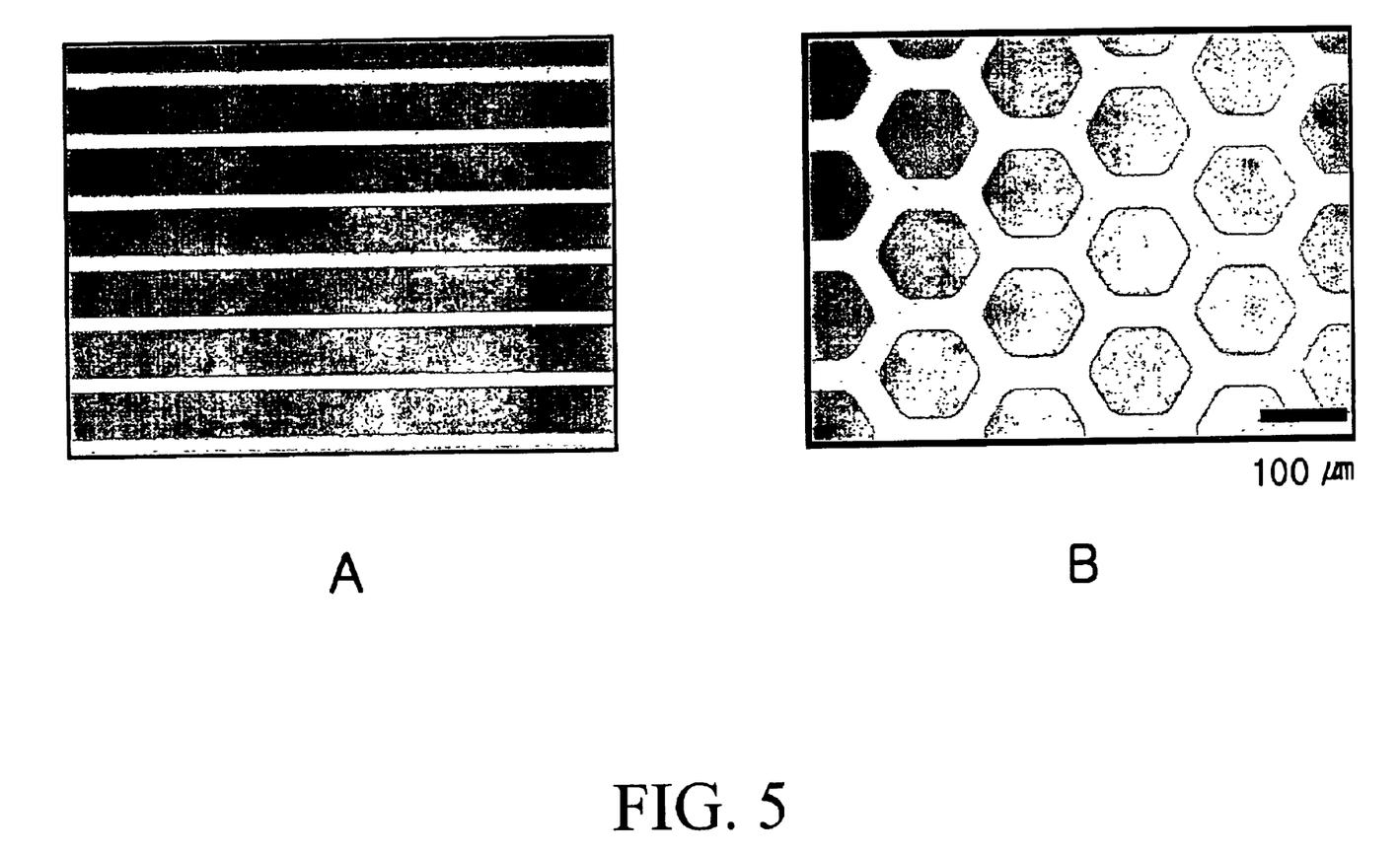
FIG. 5: a microscopic image of the metal pattern formed according to the procedure of Example 1.

FIG. 5 illustrates a microscopic image of the metal pattern formed by the above-mentioned procedure according to the present invention (A: a straight shape, and B: a honeycomb shape).

EXAMPLE 2

Figure 6:
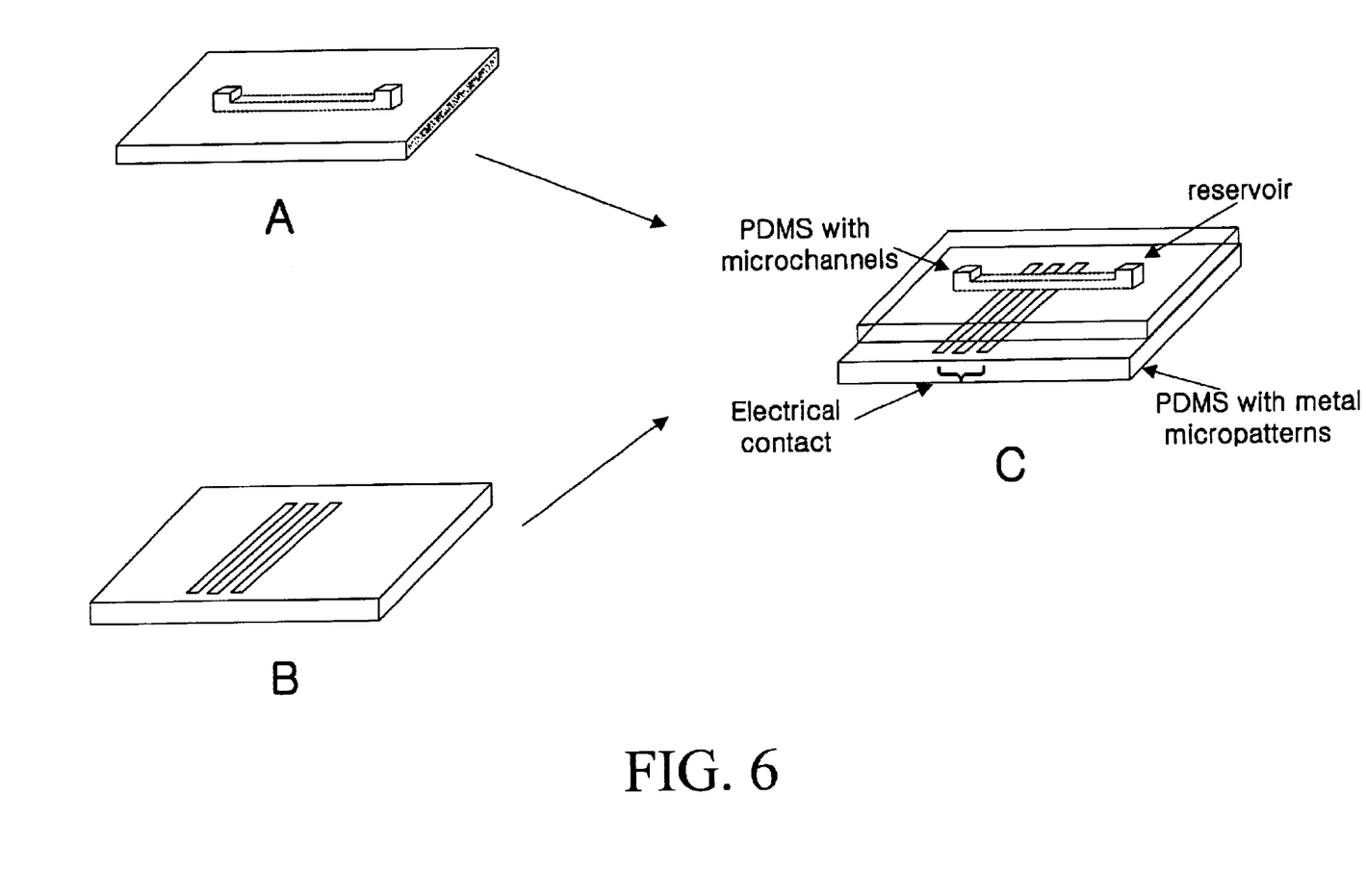
FIG. 6: a schematic illustration of the fabrication of a plastic lab-on-a-chip using the plastic substrate having metal pattern thereon prepared by the inventive procedure.

A plastic lab-on-a-chip for an electrochemical detector was fabricated as follows;

Referring to FIG. 6, "A" is a PDMS plate having microchannels prepared by a conventional replica molding method, "B" is a PDMS plate having two Au electrodes and a Ag electrode prepared as in Example 1. The surfaces of the "A" and "B" plates were treated with corona discharge, and the two plates were combined to obtain a plastic lab-on-a-chip ("C").

Figure 7:
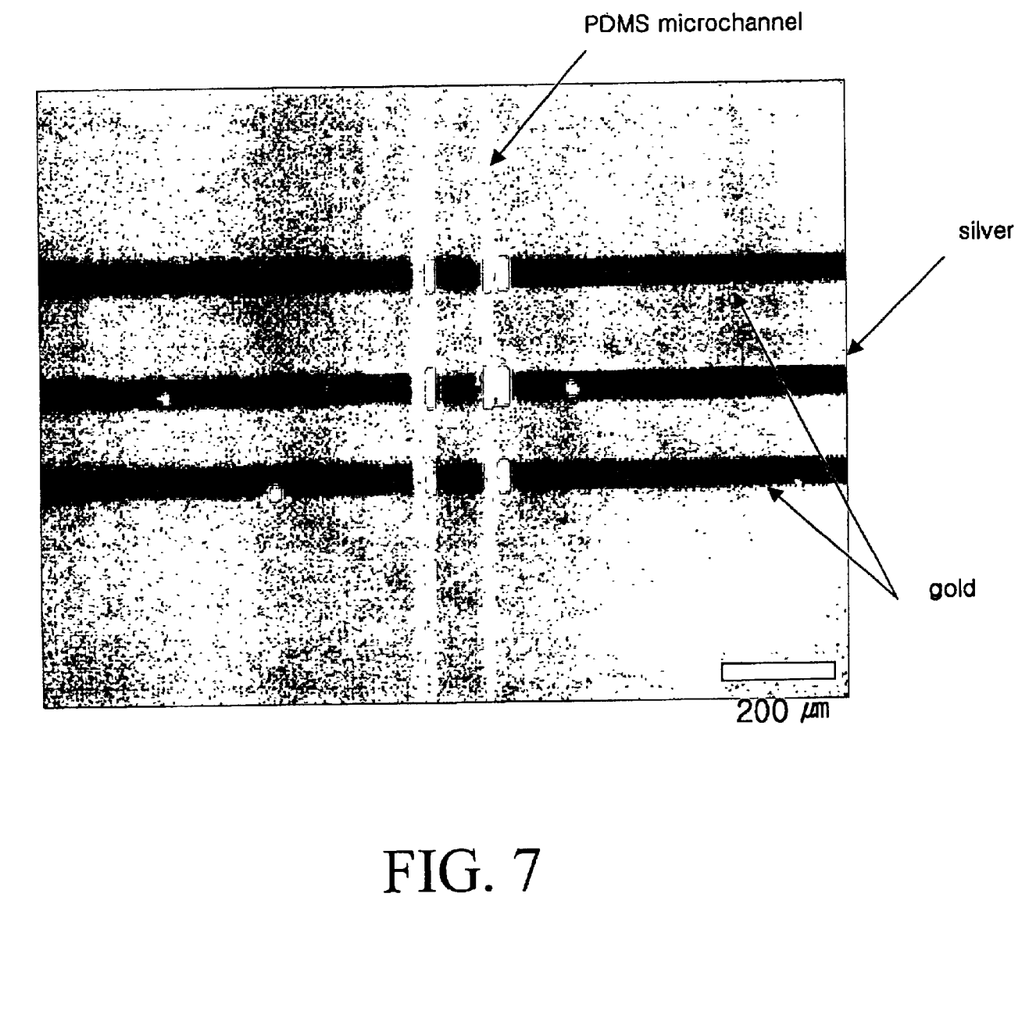
FIG. 7: a microscopic image of the gold and silver metal pattern aligned with PDMS microchannel according to the procedure of Example 2.

FIG. 7 illustrates a microscopic image of the gold and silver metal pattern aligned with PDMS microchannel. The channel size was 100 μm wide and 30 μm deep, and the electrodes, each 50 μm wide and 200 nm thick, were spaced at an interval of 100 μm. The resistance of the electrode was 60 Ω, and the electric conductivity measured when the channel was filled with 10 mM NaCl aqueous solution was about 1.6 S.

Reservoirs for providing and receiving samples were connected to the channel terminals, to fabricate a plastic lab-on-a-chip. This device can be used to electrochemical detector of electroactive compounds separated from a sample by capillary electrophoresis under a high applied voltage.

While some of the preferred embodiments of the subject invention have been described and illustrated, various changes and modifications can be made therein without departing from the spirit of the present invention defined in the appended claims.

What is claimed is:

1. A process for forming a micro-pattern of a metal on a plastic substrate, which comprises forming a metal micro-pattern on an inorganic substrate, surface-treating the surface of the metal micro-pattern or the surface of the plastic substrate to make it chemically reactive by forming a self-assembled monolayer on the surface using a self-assembling material, and bringing the metal micro-pattern into contact with the surface of the plastic substrate to transfer The metal micro-pattern from the surface of the inorganic substrate to the surface of the plastic substrate.

2. The process of claim 1, wherein the inorganic substrate is selected from the group consisting of glass, silica, mica and quartz.

3. The process of claim 1, wherein the metal is selected from the group consisting of gold(Au), silver and copper (Cu).

4. The process of claim 1, wherein the metal micro-pattern is formed by depositing a film of the metal on the inorganic substrate under a vacuum, and patterning the metal film thus deposited using a photolithographic procedure.

5. The process of claim 1, wherein the plastic substrate is selected from the group consisting of poly (dimethylsiloxane)(PDMS), poly(methylmethacrylate) (PMMA) and polycarbonate(PC).

6. The process of claim 1, which further comprises physically treating the surface of the metal micro-pattern or the plastic substrate.

7. The process of claim 6, wherein the physical treatment is conducted by applying corona discharge, plasma, electron beam or UV light to the surface.

8. The process of claim 1, wherein the surface treatment is conducted for the surface of the substrate by dipping the substrate into a 1 μM to 1 mM ethanol solution of a self-assembling material.

9. The process of claim 1, wherein the surface treatment is conducted for the surface of the substrate by contacting the substrate with the vapor of a self-assembling material.

10. The process of claim 1, wherein the self-assembling material is selected from the group consisting of a thiol-group containing compound, a trichlorosilane and a trimethoxysilane.

11. The process of claim 1 wherein the metal pattern is made of two or more metals.

* * * * *